United States Patent
Fanelli et al.

(10) Patent No.: US 10,700,012 B2
(45) Date of Patent: Jun. 30, 2020

(54) POROUS SILICON DICING

(71) Applicant: QUALCOMM Incorporated, San Diego, CA (US)

(72) Inventors: Stephen Alan Fanelli, San Marcos, CA (US); Richard Hammond, Gwent (GB)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 15/658,296

(22) Filed: Jul. 24, 2017

(65) Prior Publication Data

US 2018/0301419 A1 Oct. 18, 2018

Related U.S. Application Data

(60) Provisional application No. 62/485,646, filed on Apr. 14, 2017.

(51) Int. Cl.
| | |
|---|---|
| *H01L 23/544* | (2006.01) |
| *H01L 21/683* | (2006.01) |
| *H01L 21/304* | (2006.01) |
| *H01L 21/306* | (2006.01) |
| *H01L 21/78* | (2006.01) |
| *H01L 21/02* | (2006.01) |

(52) U.S. Cl.
CPC ......... *H01L 23/544* (2013.01); *H01L 21/304* (2013.01); *H01L 21/30604* (2013.01); *H01L 21/6836* (2013.01); *H01L 21/78* (2013.01); *H01L 21/0245* (2013.01); *H01L 21/02513* (2013.01); *H01L 21/02532* (2013.01); *H01L 21/02667* (2013.01); *H01L 2221/6834* (2013.01); *H01L 2221/68327* (2013.01)

(58) Field of Classification Search
None
See application file for complete search history.

(56) References Cited

U.S. PATENT DOCUMENTS

| | | | |
|---|---|---|---|
| 8,088,673 B2 | 1/2012 | Oyu et al. | |
| 8,399,309 B2 | 3/2013 | Ogino et al. | |
| 8,557,682 B2 | 10/2013 | Holden et al. | |
| 8,906,782 B2 | 12/2014 | Engelhardt et al. | |
| 2005/0170611 A1* | 8/2005 | Ghyselen | H01L 21/02032 438/458 |

(Continued)

FOREIGN PATENT DOCUMENTS

EP 1229582 A2 8/2002

OTHER PUBLICATIONS

International Search Report and Written Opinion—PCT/US2018/018787—ISA/EPO—dated Oct. 8, 2018.

(Continued)

*Primary Examiner* — Moazzam Hossain
*Assistant Examiner* — Stanetta D Isaac
(74) *Attorney, Agent, or Firm* — Seyfarth Shaw LLP

(57) ABSTRACT

A method of dicing a semiconductor wafer may include forming a porous silicon layer along an outline of dies singulated from the semiconductor wafer. The method may include sealing an active surface of the semiconductor wafer, including the porous silicon layer. The method may further include back grinding a rear surface of the semiconductor wafer to expose the porous silicon layer along the outline of the dies. The method also includes etching the semiconductor wafer to release the dies.

12 Claims, 14 Drawing Sheets

(56) References Cited

U.S. PATENT DOCUMENTS

| | | |
|---|---|---|
| 2006/0043534 A1 | 3/2006 | Kirby et al. |
| 2007/0099397 A1 | 5/2007 | Kirby et al. |
| 2010/0044838 A1 | 2/2010 | Mauder et al. |
| 2011/0086493 A1* | 4/2011 | Oyu ................ H01L 21/306 438/460 |
| 2012/0153425 A1* | 6/2012 | Chapelon ............ H01L 21/78 257/499 |
| 2013/0084689 A1* | 4/2013 | Arriagada ....... H01L 21/02365 438/478 |

OTHER PUBLICATIONS

Yong D., et al., "Preparation and Etching of Porous Silicon as a Sacrificial Layer used in RF-MEMS Devices," 6th International Conference on Solid-State and Integrated-Circuit Technology, Oct. 22-25, 2001, vol. 2, pp. 816-819, XP010576094, ISBN: 978-0-7803-6520-9.

* cited by examiner

POROUS SILICON DICING

CROSS-REFERENCE TO RELATED APPLICATION

The present application claims the benefit of U.S. Provisional Patent Application No. 62/485,646, filed on Apr. 14, 2017, and titled "POROUS SILICON DICING," the disclosure of which is expressly incorporated by reference herein in its entirety.

BACKGROUND

Field

The present disclosure generally relates to integrated circuits (ICs). More specifically, the present disclosure relates to porous silicon dicing.

Background

The process flow for semiconductor fabrication of integrated circuits (ICs) may include front-end-of-line (FEOL), middle-of-line (MOL), and back-end-of-line (BEOL) processes. The front-end-of-line process may include wafer preparation, isolation, well formation, gate patterning, spacer, extension and source/drain implantation, silicide formation, and dual stress liner formation. The middle-of-line process may include gate contact formation. Middle-of-line layers may include, but are not limited to, middle-of-line contacts, vias, or other layers within close proximity to the semiconductor device transistors or other active devices. The back-end-of-line process may include a series of wafer processing steps for interconnecting the semiconductor devices created during the front-end-of-line and middle-of-line processes.

Successful fabrication of modern semiconductor chip products involves interplay between the materials and the processes employed. A challenge of maintaining a small feature size applies to the fabrication of mobile radio frequency (RF) chip designs (e.g., mobile RF transceivers). The design complexity of mobile RF transceivers is complicated by the migration to a deep sub-micron process node due to cost and power consumption considerations. In particular, the design of such mobile RF transceivers for an RF front end (RFFE) becomes complex at this deep sub-micron process node. The design complexity of these mobile RF transceivers is further complicated by added circuit functions to support communication enhancements, such as carrier aggregation.

Spacing considerations also affect mobile RF transceiver design at the deep sub-micron process node. One design challenge for fabricating mobile RF transceivers is batch silicon dicing because die size is reduced at the deep sub-micron process node. Generally, once fabrication of RF integrated circuits on a substrate is complete, the wafer is divided up along dicing lines (e.g., dicing streets). The dicing lines indicate where the wafer is to be broken apart or separated into pieces. The dicing lines may define the outline of the various integrated circuits that have been fabricated on the wafer. Once the dicing lines are defined, the wafer may be sawn or otherwise separated into pieces to form the die. There is a need for an improved dicing process at the deep sub-micron node.

SUMMARY

A method of dicing a semiconductor wafer may include forming a porous silicon layer along an outline of dies singulated from the semiconductor wafer. The method may include sealing an active surface of the semiconductor wafer, including the porous silicon layer. The method may further include back grinding a rear surface of the semiconductor wafer to expose the porous silicon layer along the outline of the dies. The method also includes etching the semiconductor wafer to release the dies.

Radio frequency (RF) chips having dimpled sidewalls and/or terminated porous silicon sidewalls may be prepared by a process that includes forming a porous silicon layer on a semiconductor wafer along an outline of the RF chips that are being singulated from the semiconductor wafer. The process may also include sealing an active surface of the semiconductor wafer that includes the porous silicon layer. The process may further include back grinding a rear surface of the semiconductor wafer to expose the porous silicon layer. The process may also include etching the semiconductor wafer to release the RF chips from the semiconductor wafer.

A chip may include a die. The die may have irregularly-shaped and dimpled sidewalls. Alternatively, the die may include terminated porous silicon sidewalls.

A radio frequency (RF) module may include a diced RF chip. The diced RF chip may include a die. The die may have irregularly-shaped and dimpled sidewalls. Alternatively, the die may include terminated porous silicon sidewalls.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
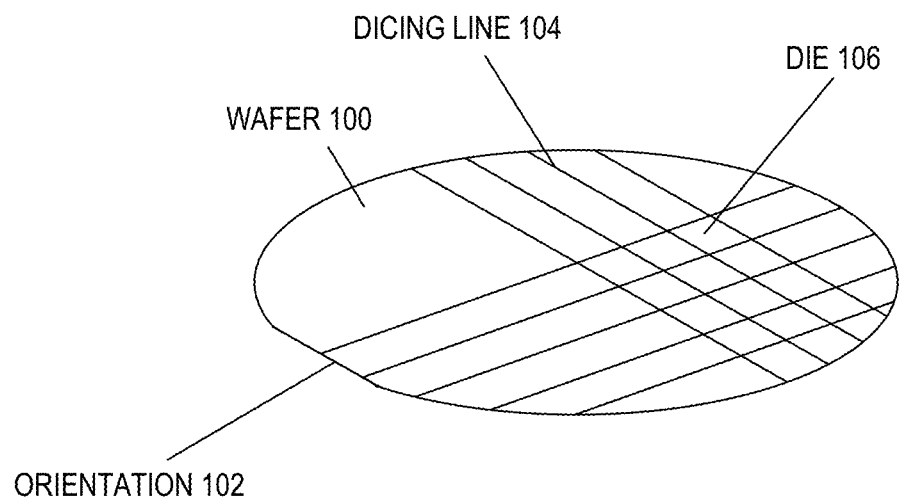
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Successful fabrication of modern semiconductor chip products involves interplay between the materials and the processes employed. A challenge of maintaining a small feature size applies to the fabrication of mobile radio frequency (RF) chip designs (e.g., mobile RF transceivers). The design complexity of mobile RF transceivers is complicated by the migration to a deep sub-micron process node due to cost and power consumption considerations. In particular, the design of such mobile RF transceivers for an RF front end (RFFE) becomes complex at this deep sub-micron process node. The design complexity of these mobile RF transceivers is further complicated by added circuit functions to support communication enhancements, such as carrier aggregation.

Spacing considerations also affect mobile RF transceiver design at the deep sub-micron process node. One design challenge for fabricating mobile RF transceivers is batch silicon dicing because die size is reduced at the deep sub-micron process node. Generally, once fabrication of RF integrated circuits on a substrate is complete, the wafer is divided up along dicing lines (e.g., dicing streets). The dicing lines indicate where the wafer is to be broken apart or separated into pieces. The dicing lines may define the outline of the various integrated circuits that have been fabricated on the wafer. Once the dicing lines are defined, the wafer may be sawn or otherwise separated into pieces to form the individual die. Various aspects of the disclosure provide techniques for porous silicon dicing.

It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

Various aspects of the disclosure provide techniques for porous silicon dicing. Generally, once fabrication of integrated circuits on a substrate is complete, the substrate is divided along dicing lines. The dicing lines indicate where the substrate is to be broken apart or separated into pieces. The dicing lines may define the outline of the various integrated circuits that have been fabricated on the substrate. Once the dicing lines are defined, the substrate may be sawn or otherwise separated into pieces to form the die. The die area boundary may include a non-functional boundary area according to a groove created by a dicing saw blade (kerf) along the dicing street. Alternatively, laser dicing may be performed to provide separation between the die and a kerf area at the edge of the die.

The dicing process for RF integrated circuits supported by a substrate may be improved by using porous silicon. Porous silicon may be fabricated by introducing a silicon wafer to an electro-chemical etch in dilute hydrofluoric acid. The degree of porosity of the porous silicon may be controlled by a current density, a concentration of the acid, and a duration of the etch. Porous silicon is relatively cheap to produce. According to the present disclosure, a porous layer is formed on a processed wafer to provide narrow scribes, which leads to simplified batch dicing.

In aspects of the present disclosure, a porous silicon layer is formed in the dicing streets to allow dicing of the wafer using a batch wet etch process. The batch release process may significantly reduce the cost and the cycle time for dicing wafers. For example, dies may be outlined with a porous silicon layer using reduced size dicing streets, as a saw blade is not used to dice the wafer. As a result, a kerf area loss (e.g., due to the conventional saw blade process) is substantially reduced. In this configuration, diced RF chips may have dimpled sidewalls and/or terminated porous silicon sidewalls. That is, the transition between the single crystal silicon and the porous silicon may be dimpled. In another configuration, the die has scalloped sidewalls. Alternatively, the die may have irregularly-shaped and dimpled sidewalls, or sidewalls that are otherwise irregularly-shaped (e.g., dimpled and/or scalloped sidewalls).

FIG. 1 illustrates a perspective view of a wafer. A wafer 100 may be a semiconductor wafer, or may be a substrate material with one or more layers of material on a surface of the wafer 100. The wafer 100 may be a compound material, such as gallium arsenide (GaAs) or gallium nitride (GaN), a ternary material such as indium gallium arsenide (InGaAs), quaternary materials, silicon, quartz, glass, or any material that can be a substrate material. Although many of the materials may be crystalline in nature, polycrystalline or amorphous materials may also be used for the wafer 100. For example, various options for the substrate include a glass substrate, a semiconductor substrate, a core laminate substrate, a coreless substrate, a printed circuit board (PCB) substrate, or other like substrates.

The wafer 100, or layers that are coupled to the wafer 100, may be supplied with materials that enable formation of different types of electronic devices in or on the wafer 100. In addition, the wafer 100 may have an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100, assuming a semiconductor wafer.

Figure 4A:
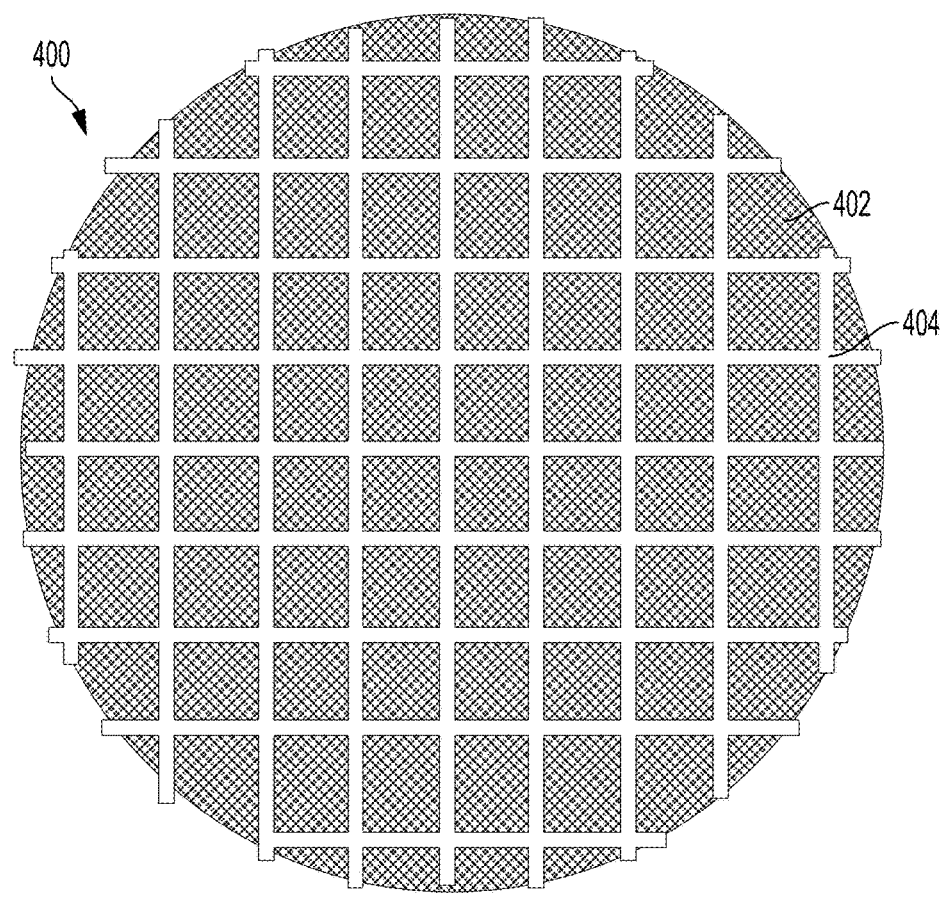
FIGS. 4A-4G illustrate a process for dicing a semiconductor substrate according to aspects of the present disclosure.

Once the wafer 100 has been processed as desired, the wafer 100 is divided up along dicing lines 104. For example, once fabrication of integrated circuits on the wafer 100 is complete, the wafer 100 is divided up along the dicing lines 104, which may be referred to herein as "dicing streets." The dicing lines 104 indicate where the wafer 100 is to be broken apart or separated into pieces. The dicing lines 104 may define the outline of the various integrated circuits that have been fabricated on the wafer 100. For example, FIG. 4A illustrates a wafer 400, including porous dicing streets, according to aspects of the present disclosure.

Once the dicing lines 104 are defined, the wafer 100 may be separated into pieces to form the die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
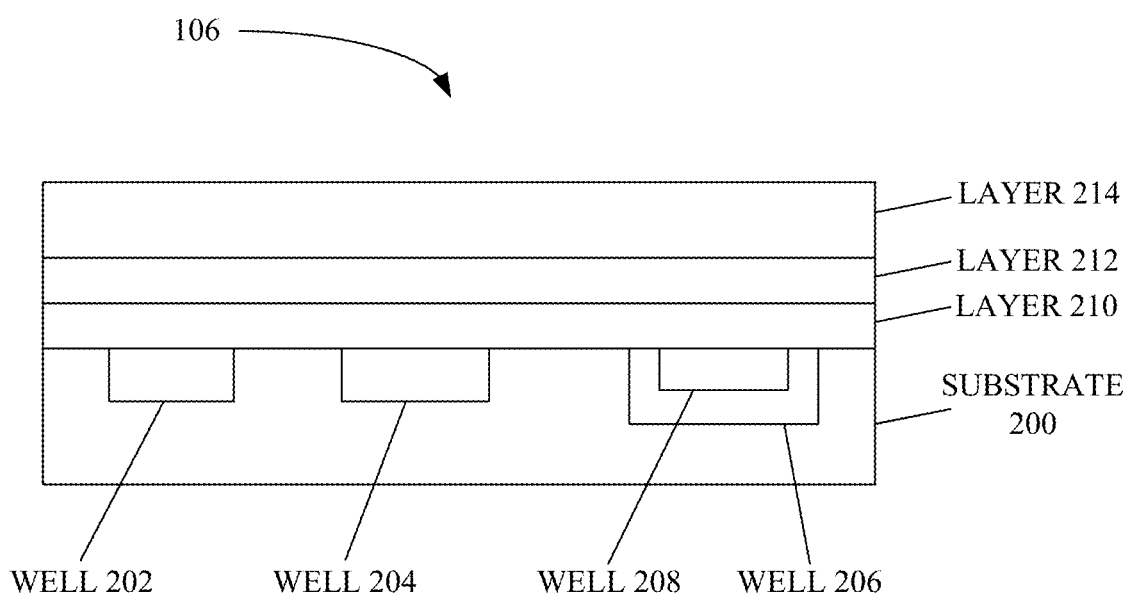
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200. Alternatively, the substrate may be a semi-insulating substrate, including compound semiconductor transistors.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT), a heterojunction bipolar transistor (HBT), or other like compound semiconductor transistor. The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 9:
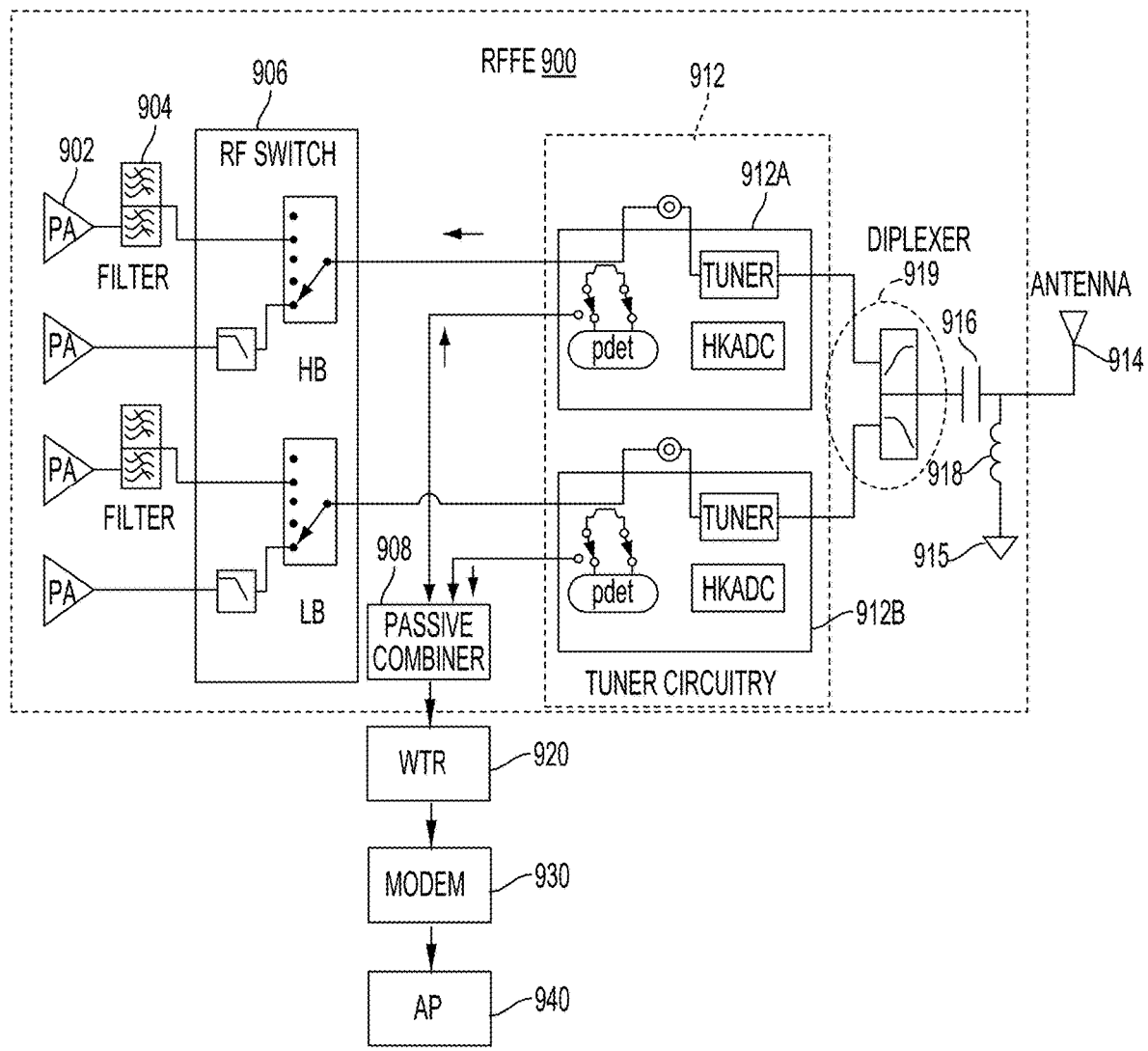
FIG. 9 is a schematic diagram of a radio frequency (RF) front end (RFFE) module employing RF chips having a porous semiconductor handle substrate according to an aspect of the present disclosure.
Figure 10:
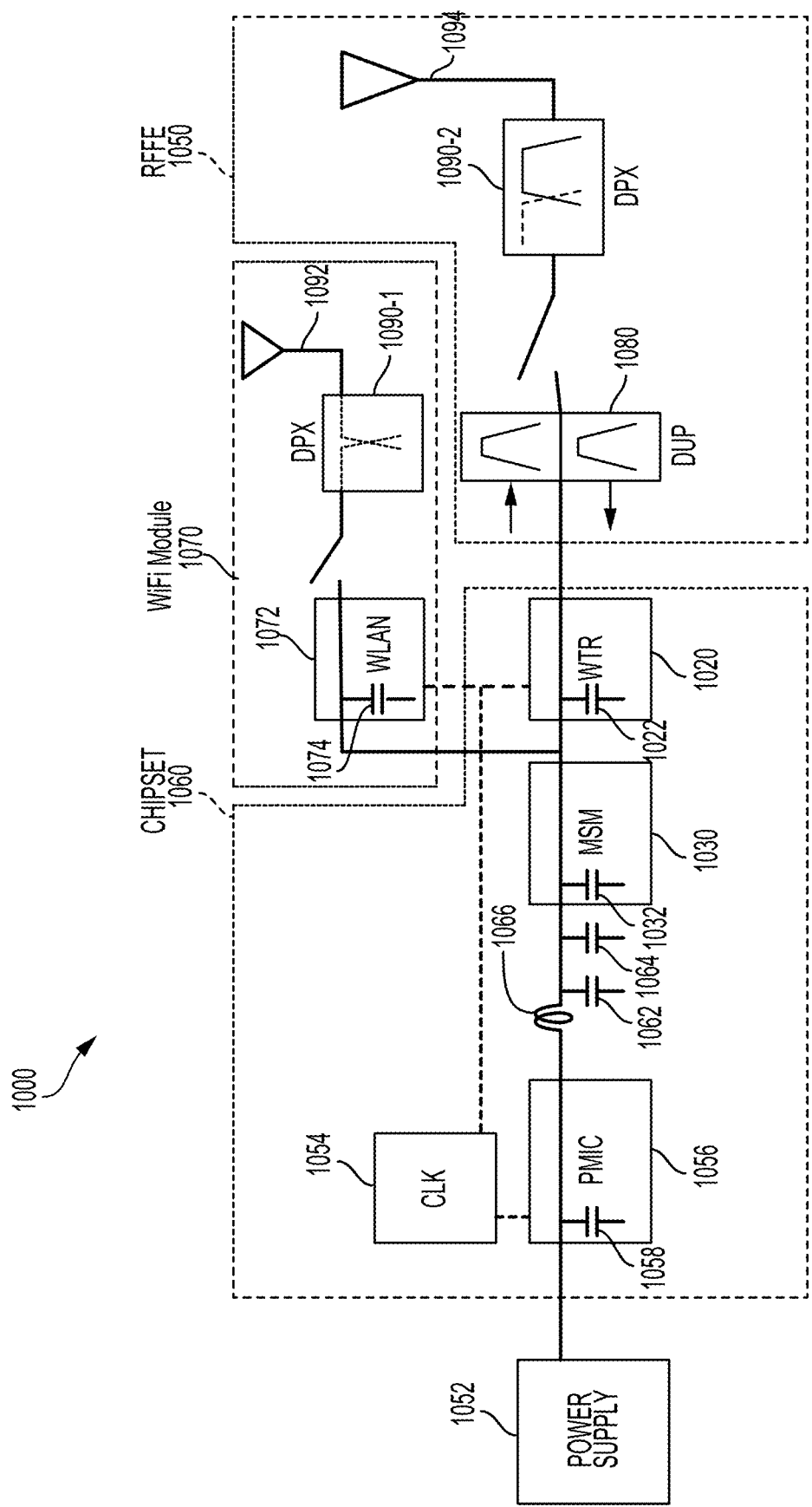
FIG. 10 is a schematic diagram of a WiFi module and a radio frequency (RF) front end (RFFE) module employing RF chips including a porous semiconductor handle substrate for a chipset to provide carrier aggregation according to aspects of the present disclosure.

Aspects of the present disclosure provide diced RF chips, such as compound semiconductor transistors. These diced RF chips may also include filters, diplexers, triplexers, low pass filters, and/or a notch filter, or other like circuit elements useful in the formation of radio frequency (RF) front end modules, for example, as shown in FIGS. 9 and 10.

Various aspects of the disclosure provide techniques for porous silicon dicing of RF integrated circuits. Conventionally, once fabrication of RF integrated circuits on a substrate is complete, the substrate is divided along dicing lines. The dicing lines indicate where the substrate is to be broken apart or separated into pieces. The dicing lines may define the outline of the various RF integrated circuits that have been fabricated on the substrate. Once the dicing lines are defined, the substrate is separated into pieces to form the die. The die area boundary may include a non-functional boundary area according to a groove created by a dicing saw blade (kerf) along the dicing street. Alternatively, laser dicing may be performed to provide separation between the die and a kerf area at the edge of the die.

The dicing process may be improved by using porous silicon. Porous silicon may be fabricated by introducing a silicon wafer to an electro-chemical etch in dilute hydrofluoric acid. The degree of porosity of the porous silicon may be controlled by a current density, a concentration of the acid, and a duration of the etch. Porous silicon is relatively cheap to produce. According to the present disclosure, a porous layer is formed on a processed wafer to provide narrow scribes, which leads to simplified batch dicing, for example, as shown in FIGS. 4A-4G.

In aspects of the present disclosure, a porous silicon layer is formed in the dicing streets to allow dicing of the wafer using a batch wet etch process. For example, the porous silicon may be formed when silicon is anodized through an electrochemical process, such as, for example, in a hydrofluoric (HF) solution. The porous silicon layer may be sealed (e.g., by heating) to prevent liquid or gas from entering the pores, which may complicate processing of the wafer. For example, the porous silicon layer may be sealed for a longer or shorter period of time to vary a sealing depth. Additionally, high temperature annealing in, for example, hydrogen ($H_2$), may seal the pores at or near the surface of the porous silicon layer, which improves the quality of the substrate for subsequent growth of epitaxial layers.

For example, the porous silicon wafer may be annealed at hydrogen ambient for more than 30 minutes at a temperature of ~1100° C. (2012° F.) to close voids on the surface. Annealing for a few seconds using Ar—$H_2$ mesoplasma also has significant effects on the porous silicon wafer, similar to those obtained by annealing in hydrogen for more than 30 minutes. A non-limiting example of a temperature range for the annealing may be from ~260° C. (500° F.) to 1100° C. (2012° F.).

According to aspects of the present disclosure, the batch release process may significantly reduce the cost and the cycle time for dicing wafers. For example, dies may be outlined with a porous silicon layer using smaller dicing streets, as a saw blade is not used to dice the wafer. As a result, a kerf area loss (e.g., due to the conventional saw blade process) is substantially reduced. According to aspects of the present disclosure, radio frequency (RF) chips may be fabricated on a wafer and diced using the back release process as described herein.

Figure 3:
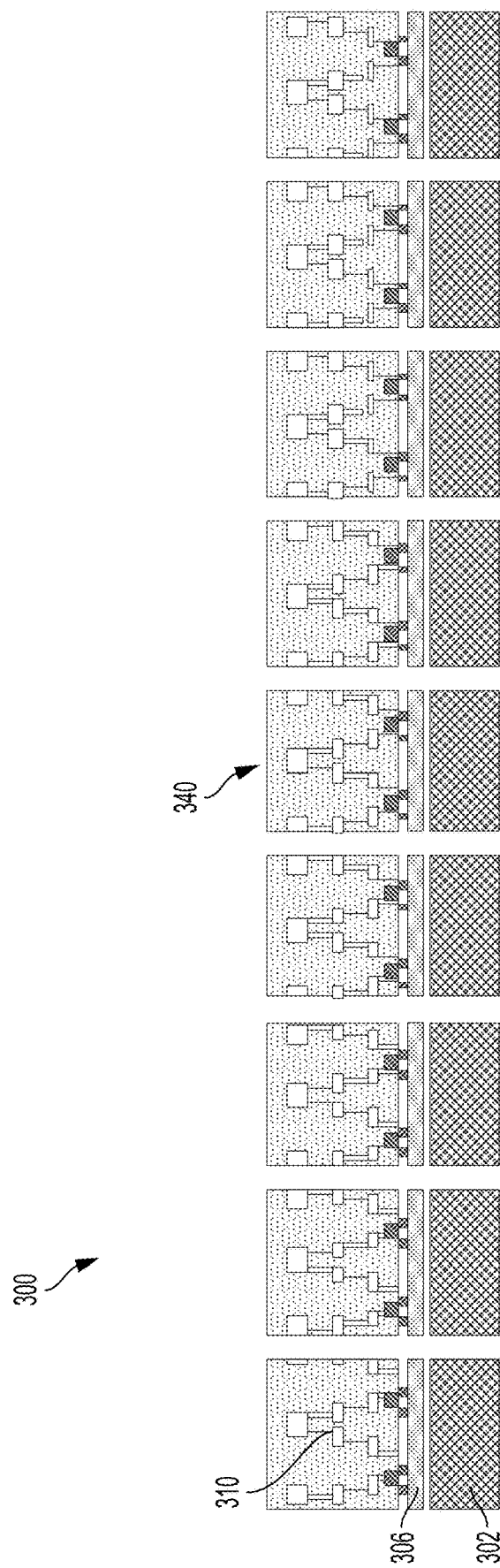
FIG. 3 illustrates a cross-sectional view of multiple radio frequency (RF) chips having dimpled sidewalls and/or terminated porous silicon sidewalls prepared by a porous silicon dicing process according to aspects of the present disclosure.

FIG. 3 illustrates a cross-sectional view of multiple radio frequency (RF) chips 300 (e.g., dies) having dimpled sidewalls and/or terminated porous silicon sidewalls prepared by a porous silicon dicing process according to aspects of the present disclosure. Each of the die 340 may include an active device layer 306 on a substrate 302. For example, the substrate 302 may be silicon (Si) (e.g., a bulk semiconductor handle wafer or a semiconductor on insulator (SOI) wafer). Alternatively, the substrate 302 may be a compound semiconductor substrate (e.g., gallium arsenide (GaAs), gallium nitride (GaN), indium gallium arsenide (InGaAs), etc.) Furthermore, a dielectric layer 310, including RF integrated circuits, may be fabricated on the active device layer 306.

FIGS. 4A-4F illustrate a process for dicing a wafer 400 according to aspects of the present disclosure.

FIG. 4A illustrates a top view of the wafer 400. As depicted, the process for dicing may include etching the wafer 400 along porous dicing streets 404. The porous dicing streets 404 may be formed by exposing dicing streets of a substrate 402 to an electro-chemical etch. For example, the silicon oxide (SiOx)/nitride (Ni) mask may be used to selectively expose portions of the wafer 400 for etching. A porosity of the porous dicing streets 404 may be varied by a current density, a concentration of the acid, and a duration of the etch. The porous dicing streets 404 may form a uniform rectangular grid pattern on the wafer 400, or may be unequally sized and/or shaped, according to various aspects. In one arrangement, the porous dicing streets 404 may be approximately 20 microns wide. By contrast, conventional dicing streets are generally about 70 microns wide. The narrower dicing streets allow for more dies to be diced from a single wafer, thus significantly saving costs.

Figure 4B:
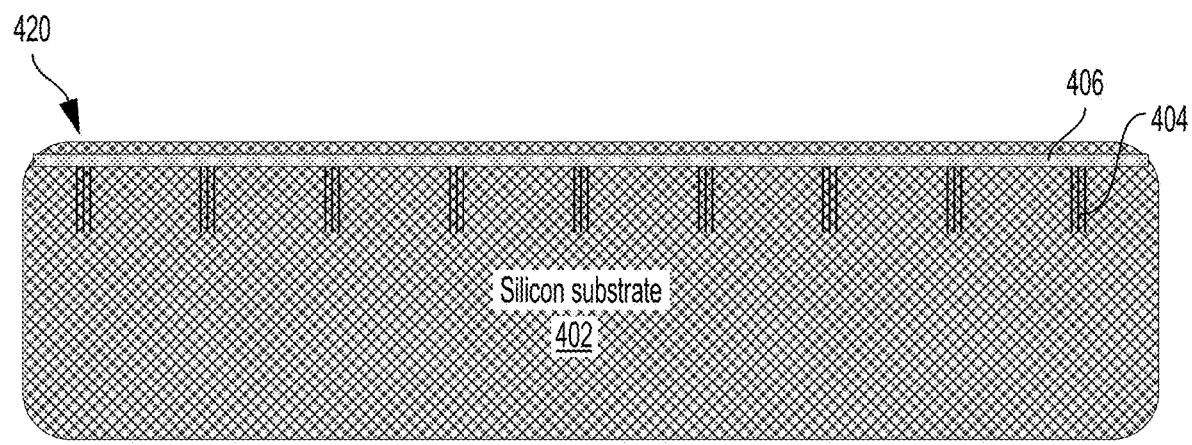

FIG. 4B illustrates a cross-sectional side view of the wafer 400. According to an aspect, the substrate 402 includes a device layer 406 for fabrication of active and passive devices, including but not limited to, transistors, resistors, capacitors, inductors, diodes, and other like active/passive devices. For example, the device layer 406 may be on a front-side 420 of the substrate 402.

According to an aspect of the disclosure, a depth of the porous dicing streets 404 may be varied by a current density, a concentration of the acid, and a duration of the etch. For example, the depth may correspond to how far a subsequent back grind process would go to expose the porous dicing streets. In addition, a depth of the back grind process also determines an ultimate thickness of the die. The depth of the back grind may be in the range of 100-200 microns, although other ranges are possible according to aspects of the present disclosure.

Figure 4C:
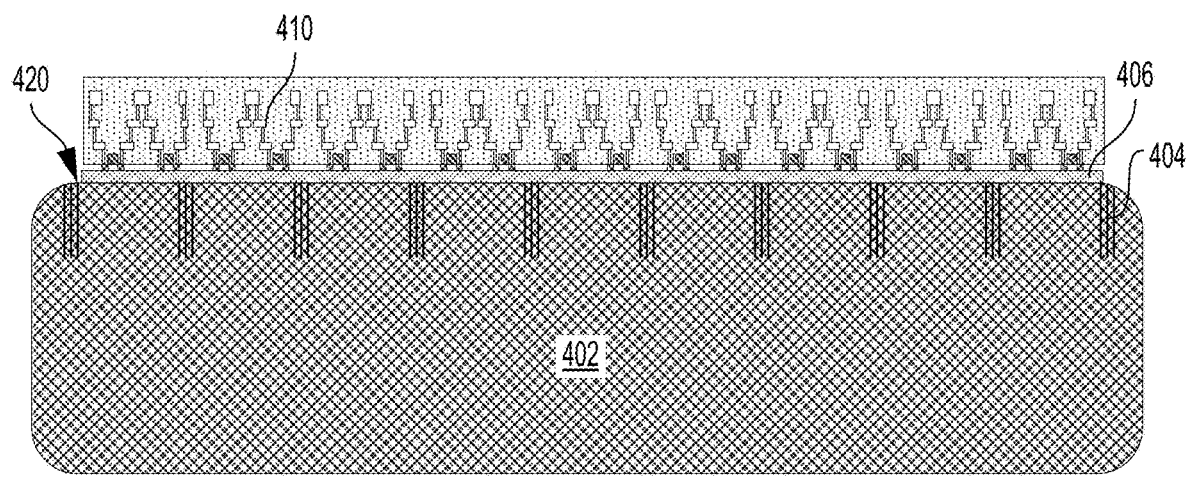
Figure 4D:
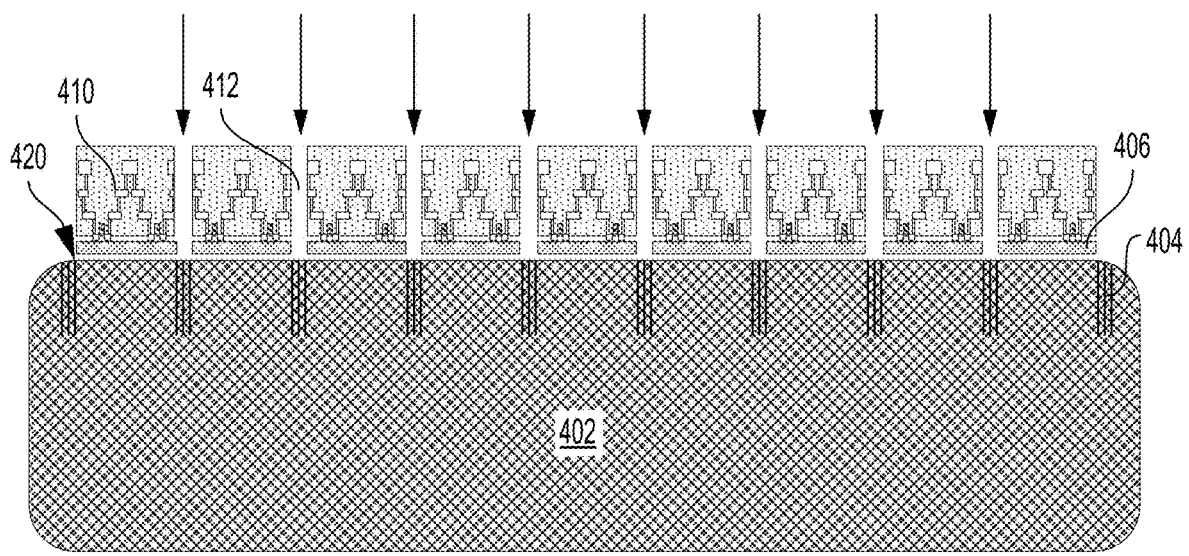

As illustrated in FIGS. 4C-4D, a dielectric layer 410 may be fabricated on the device layer 406. For example, the dielectric layer 410 may include RF integrated circuits. Subsequently, the RF integrated circuits in the dielectric layer 410 may be separated along streets 412. For example, the streets 412 may correspond to the porous dicing streets 404. The streets 412 may be formed by laser grooving or a tetramethylammonium hydroxide (TMAH) selective etch. The laser grooving may be subsequently performed in the process, as described below with respect to FIG. 4F.

Figure 4E:
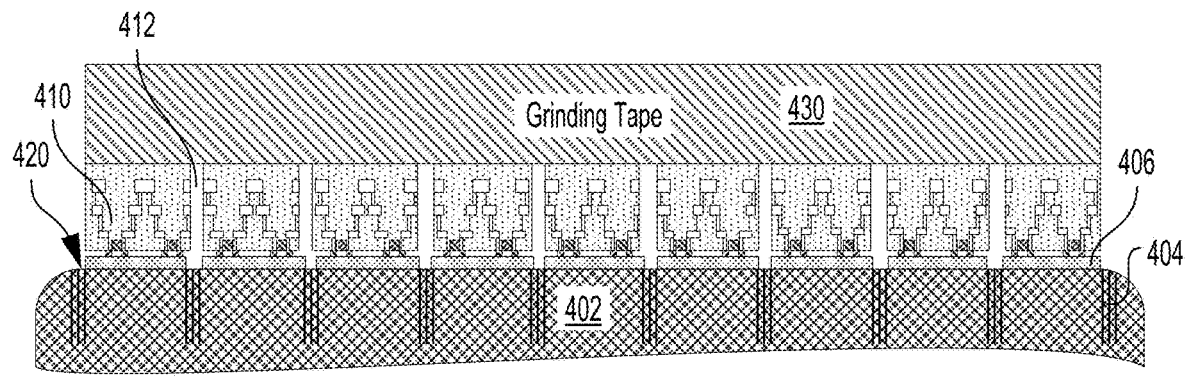

As illustrated in FIG. 4E, a grinding tape 430 may be attached to a side of the dielectric layer 410 opposite the device layer 406. For example, the grinding tape 430 may be a temporary bonding adhesive tape removably attached to the dielectric layer 410. The substrate 402 may then be subjected to a back grind to expose the porous dicing streets 404.

Figure 4F:
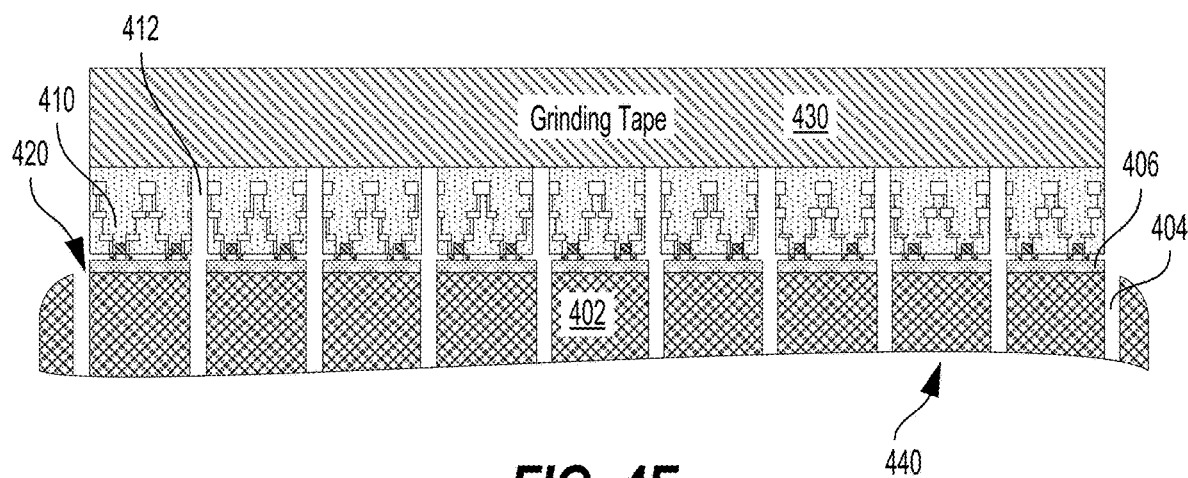

As illustrated in FIG. 4F, a selective etch may be used to etch the porous dicing streets 404 to separate each of the dies 440. In one aspect of the present disclosure, the selective etching is a tetramethylammonium hydroxide (TMAH) selective etching of the porous dicing streets 404 to release multiple (e.g., a plurality of) diced radio frequency (RF) chips. Additionally, xenon difluoride ($XeF_2$), $SF_6$ plasma, and other related plasma etch gasses may be used to release each of the dies 440.

According to an aspect of the present disclosure, the laser grooving may be applied to etch the dielectric layer 410 after the selective etch, rather than as indicated before in relation to FIG. 4D. Additionally, the selective etch may also be used to etch the dielectric layer 410. This way, an additional masking step is not needed for lining up the streets 412 with the porous dicing streets 404. The selective etch itself would expose portions of the dielectric layer 410 that correspond to streets 412 to be etched/grooved.

According to an aspect of the present disclosure, the dies 440 may each have dimpled sidewalls and/or terminated porous silicon sidewalls. For example, the transition between the single crystal silicon and the porous silicon may be dimpled. In another configuration, the die has scalloped sidewalls. Alternatively, the die may have irregularly-shaped and dimpled sidewalls, or sidewalls that are otherwise irregularly-shaped (e.g., dimpled and/or scalloped sidewalls).

Figure 4G:
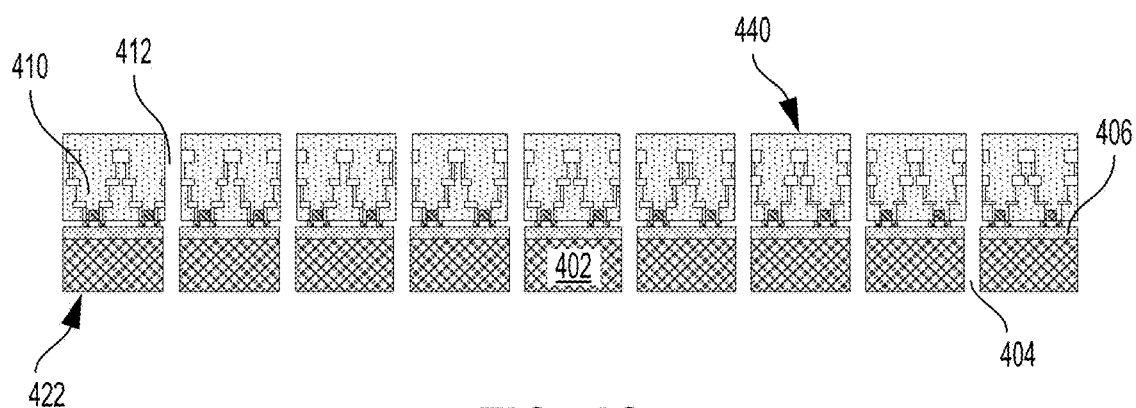

FIG. 4G illustrates the dies 440 formed by the wafer dicing process. For example, a back grind process may smooth out a second side 422 of the substrate 402 opposite the device layer 406, and the grinding tape 430 may be removed. According to aspects of the present disclosure, the dies 440 may be various shapes and sizes. For example, the dies 440 may be square, triangular, rectangular, circular, hexagonal, pentagonal, etc., and of various sizes as well.

Advantages of the batch release process include a significant reduction in the cost and the cycle time for dicing wafers, as well as a higher yield per wafer. For example, dies may be outlined with a porous silicon layer using smaller dicing streets, as a saw blade is not used to dice the wafer. As a result, a kerf area loss (e.g., due to the conventional saw blade process) is substantially reduced and more dies may be produced per wafer. Additionally, a higher selectivity for the porous silicon allows for more precise and quicker dicing.

Figure 5A:
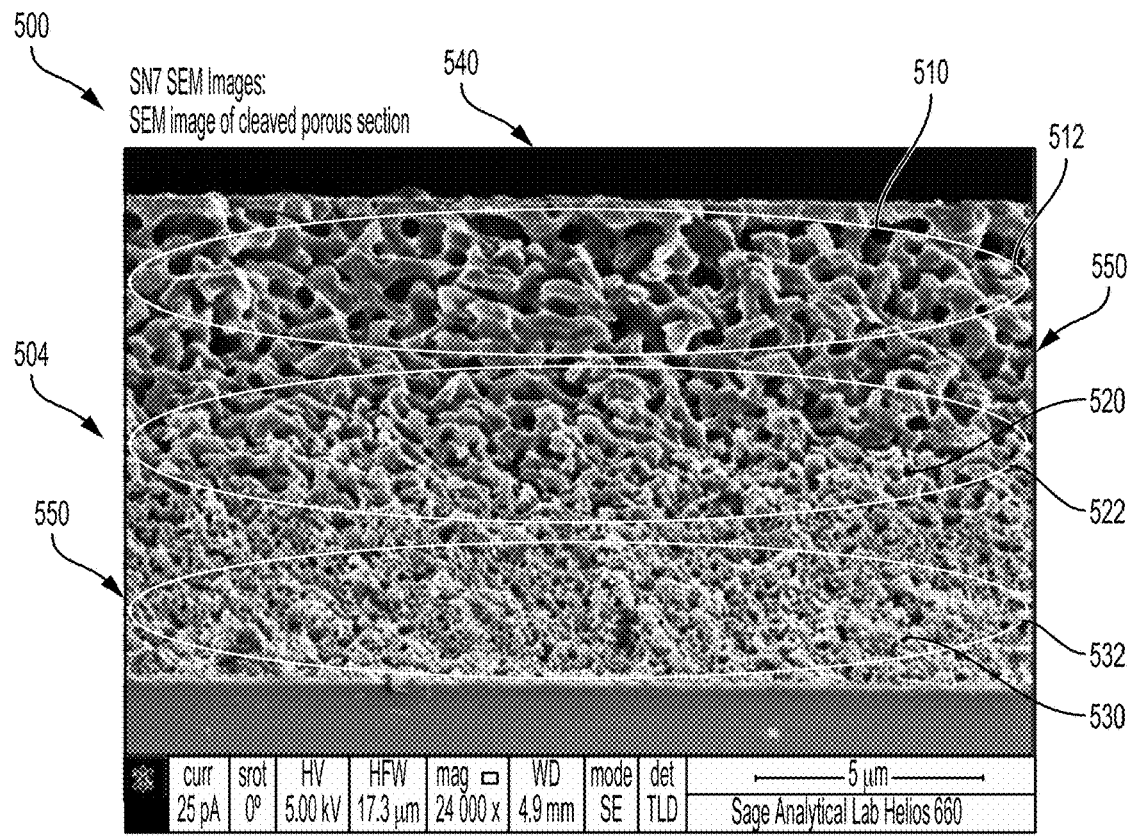
FIGS. 5A-5C illustrate different porosities of the semiconductor substrate according to aspects of the present disclosure.
Figure 5B:
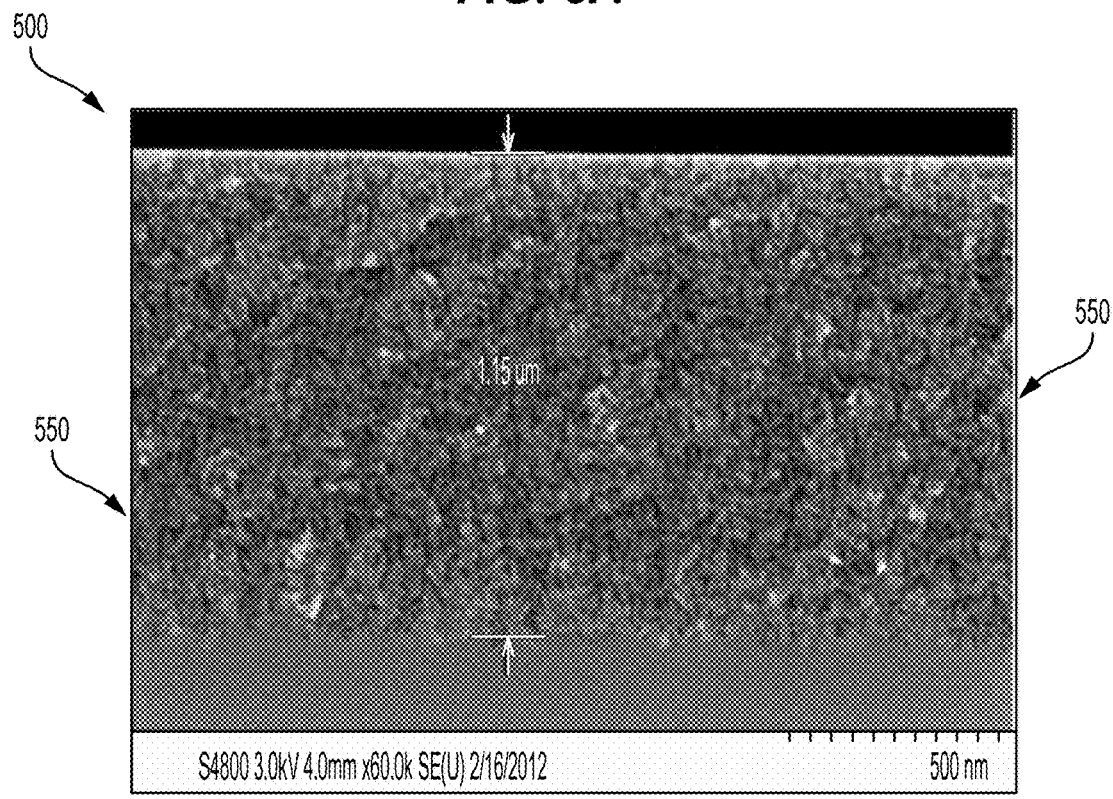
Figure 5C:
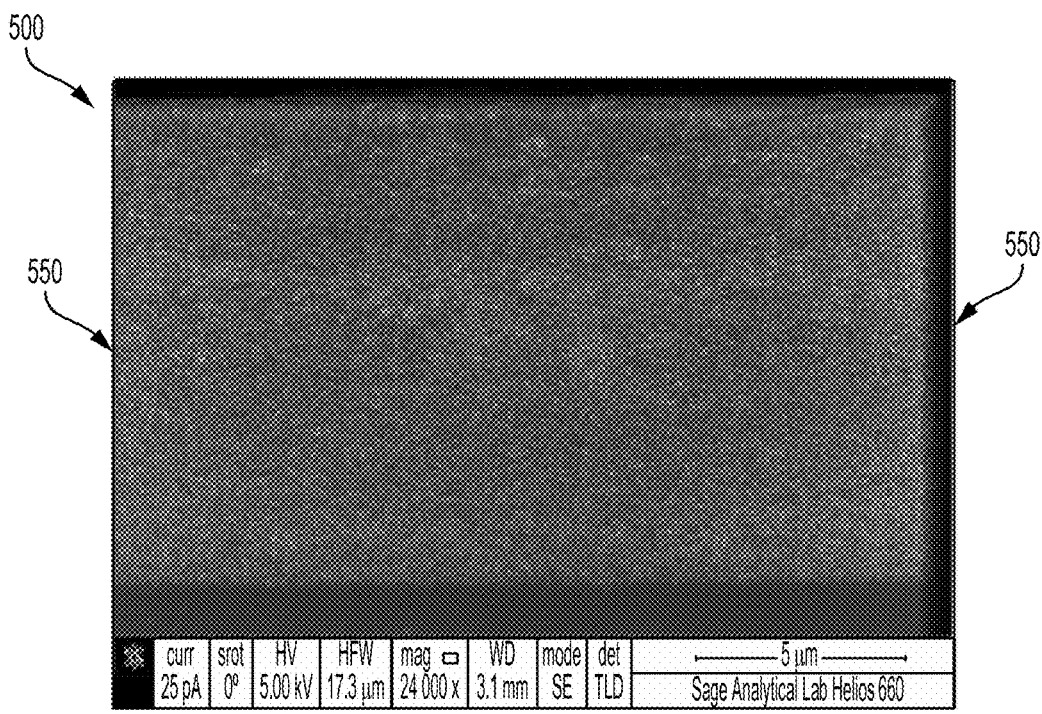

FIGS. 5A-5C illustrate different porosities of a porous dicing street 504 of a substrate 500 (e.g., a semiconductor substrate, such as bulk silicon) according to aspects of the present disclosure. FIGS. 5A-5C show what sidewalls of the singulated chips would look like after dicing.

FIG. 5A illustrates a porous dicing street 504 that is 40% porous. For example, the porous dicing street 504 may correspond to the porous dicing streets used to dice a substrate 500. The porosity of the porous dicing street 504 may include pores of varying sizes, such as including, but not limited to, large pores 510, medium pores 520, and small pores 530.

According to an aspect of the present disclosure, the porous dicing street 504 may include large pores 510 around a first region 512, medium pores 520 around a second region 522, and small pores 530 around a third region 532 of the porous dicing street 504. For example, the sizes of the pores may decrease towards the third region 532 of the porous dicing street 504, and may increase towards the first region 512 of the porous dicing street 504, thus creating different depths with different porosities. This may be due to the chemical etch etching inward from the first surface 540 of the substrate 500. Because the first surface 540 is etched first, and the chemical etch penetrates deeper from the first surface 540, the second region 522 and the third region 532 are less affected, resulting in smaller pores toward the third region 532.

FIG. 5B illustrates porous dicing street 504 that is 30% porous. The porosity of the porous dicing street 504 may be more uniform as compared to the 40% porous substrate of FIG. 5A. This may be due to the chemical etch affecting the first surface 540 more evenly at a lower porosity. As the desired porosity increases, the sizes of the pores may vary greater according to their depths in relation to the first surface 540, because the direction of the chemical etch moves inward from the first surface 540.

FIG. 5C illustrates a porous dicing street 504 that is 20% porous. The porosity of the porous dicing street 504 may be more uniform as compared to the 30% porous substrate of FIG. 5B. Similar to the above for FIG. 5B, this may be due to the chemical etch affecting the first surface 540 more evenly at a lower porosity. Accordingly, if a more uniform distribution of pores is desired, a lower porosity may be chosen.

According to aspects of the present disclosure, etching away the porous dicing street 504 exposes sidewalls 550 of the substrate 500. For example, the sidewalls 550 may be dimpled or scalloped due to the shape of the pores that were etched away. The substrate 500 may also include sidewalls 550 that are composed of terminated porous silicon. For example, a transition between the single crystal silicon structure of the substrate 500 and the porous dicing street 504 may be dimpled. According to additional aspects, a size of the dimples/scalloped portions may vary based on whether the pores are large, medium, or small. For example, larger dimples may be toward the first surface 540, and smaller dimples may be away from the first surface 540. Alternatively, the sidewalls 550 may be otherwise irregularly-shaped and non-uniform.

Figure 6A:
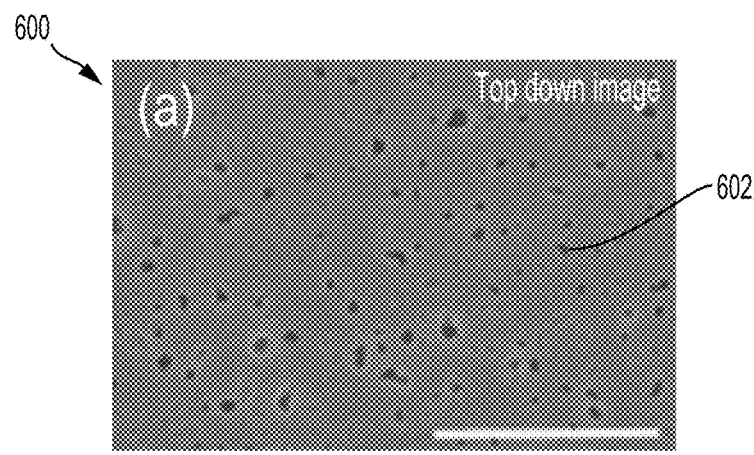
FIG. 6A illustrates a top view of a semiconductor substrate before sealing according to aspects of the present disclosure.

FIG. 6A illustrates a top view of a substrate 600 (e.g., a semiconductor substrate) before sealing according to aspects of the present disclosure. As depicted, prior to sealing, the substrate 600 includes pores 602, which may allow unwanted gas or liquid to enter and would complicate processing of a wafer. Sealing of the substrate 600 may be advantageous for preventing the unwanted gas or liquid from entering the pores.

Figure 6B:
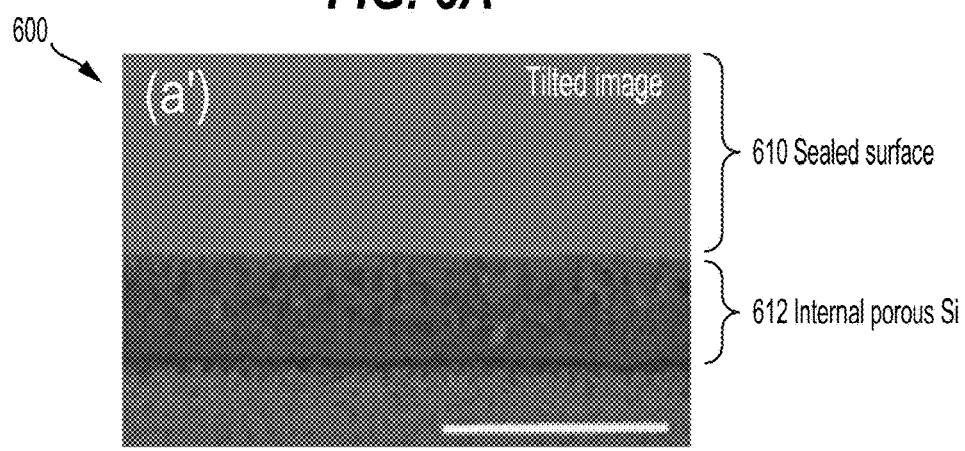
FIG. 6B illustrates a cross-sectional side view of a semiconductor substrate after sealing according to aspects of the present disclosure.

FIG. 6B illustrates a cross-sectional side view of the substrate 600 after sealing according to aspects of the present disclosure. For example, the substrate 600 may be sealed at a first surface 610, and may remain porous at a porous layer 612 below the first surface 610. According to an aspect, the substrate 600 may be sealed for a longer or shorter period of time to vary a sealing depth of the first surface 610. Additionally, high temperature annealing in, for example, hydrogen ($H_2$), may seal the pores 602 at or near the surface of the porous silicon layer, which improves the quality of the substrate for subsequent growth of epitaxial layers.

For example, the substrate 600 may be annealed at hydrogen ambient for more than 30 minutes at a temperature of ~1100° C. (2012° F.) to close voids on the surface. Annealing for a few seconds using Ar—$H_2$ mesoplasma also has significant effects on the substrate 600, similar to those obtained by annealing in hydrogen for more than 30 minutes. A non-limiting example of a temperature range for the annealing may be from ~260° C. (500° F.) to 1100° C. (2012° F.).

Figure 7:
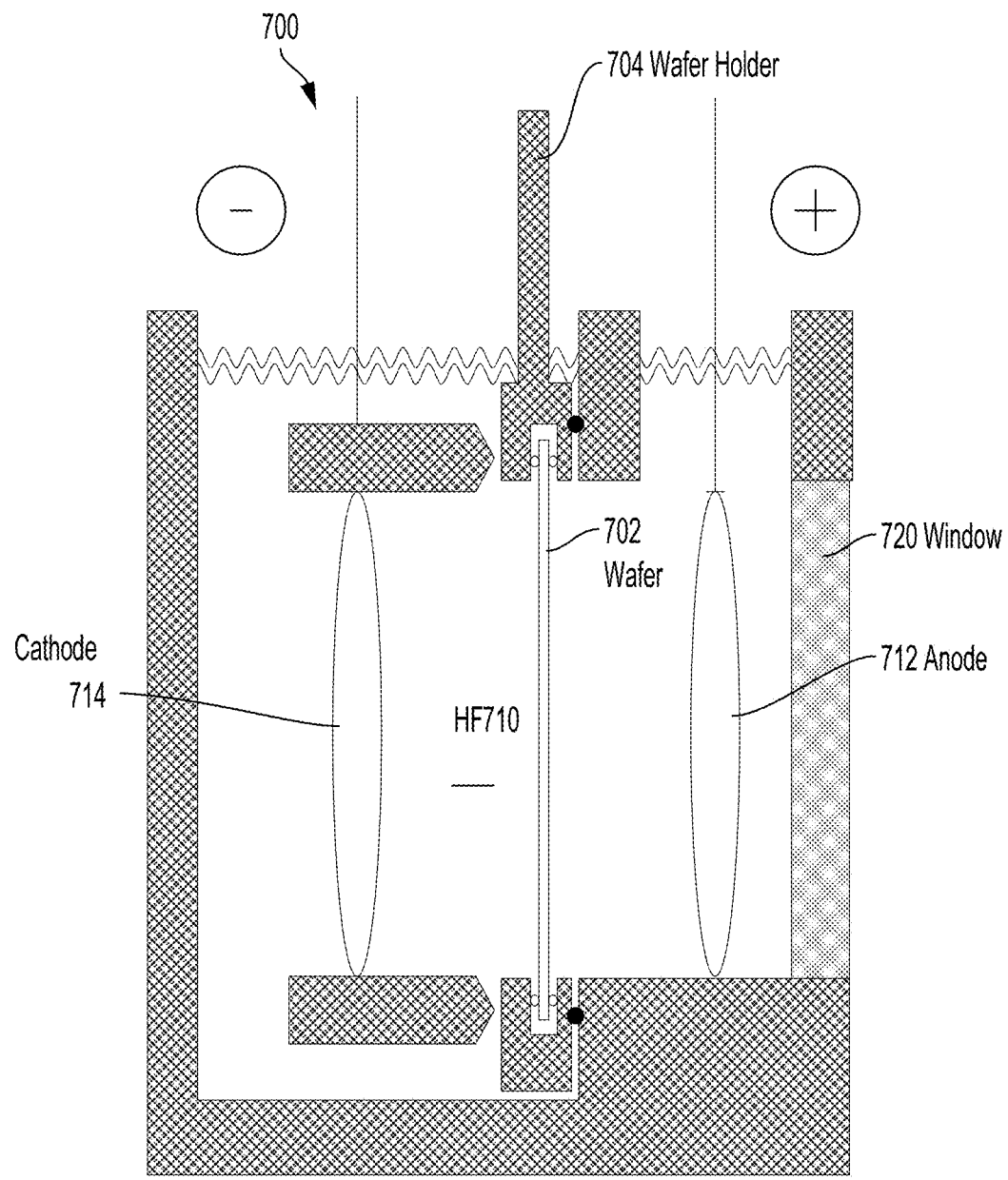
FIG. 7 illustrates an electro-chemical etch process for forming porous silicon according to aspects of the present disclosure.

FIG. 7 illustrates an electro-chemical etch 700 for forming porous silicon according to aspects of the present disclosure. For example, a porous silicon layer is formed in dicing streets to allow dicing of a wafer 702 using a batch wet etch process. Porous silicon may be formed when silicon is anodized through an electrochemical process, such as, for example, in a hydrofluoric (HF) solution.

According to an aspect, the wafer 702 (e.g., silicon (Si)) to be etched is held in place in a hydrofluoric bath 710 by a wafer holder 704. A current is then applied across the anode 712 and the cathode 714, which causes the wafer 702 to be etched. A window 720 allows the etch process to be observed.

A desired degree of porosity for the wafer 702 may be controlled by varying a current density, a concentration of the acid, and a duration of the etch. The higher the current density, the acid concentration, and the duration, the higher the etch, which results in higher porosity.

According to aspects of the present disclosure, the electrochemical etch 700 may be modified to only etch a single side of the wafer 702. For example, the wafer holder 704 may include a backing (not shown) to only expose one side of the wafer 702. Additionally, the wafer holder may hold the wafer 702 around its circumference, thus creating an unetched portion around the circumference of the wafer 702. The wafer holder 704 may otherwise be modified to hold the wafer 702 while covering portions of the wafer 702 not to be etched, for example with photoresist.

According to an aspect of the present disclosure, a mask (not shown) may be used to etch porous dicing lines into the wafer 702 to correspond to streets on a die. For example, the mask may be integrated into the wafer holder 704 to expose portions of the wafer 702 corresponding to dicing lines. The mask may also cause the porous dicing lines to be arranged in any configuration. For example, the porous dicing streets may be a grid pattern with rectangular and square portions of various sizes, or other shapes (e.g., circular, triangular, pentagonal, hexagonal, etc.) and various sizes.

Figure 8:
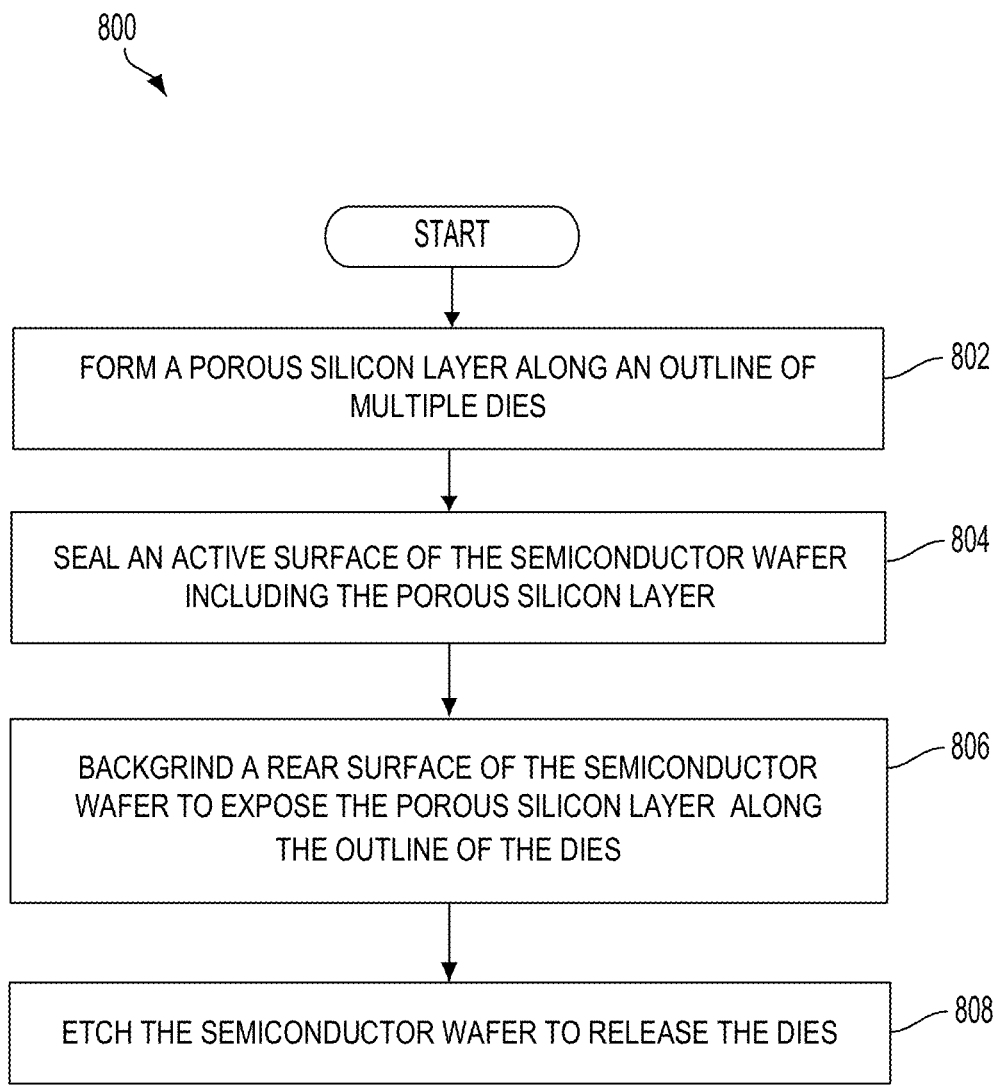
FIG. 8 is a process flow diagram illustrating a method of dicing a semiconductor substrate according to an aspect of the present disclosure.

FIG. 8 is a process flow diagram illustrating a method 800 for dicing a semiconductor substrate according to an aspect of the present disclosure. The method 800 may begin at block 802, in which a porous silicon layer is formed along an outline of multiple dies. For example, as shown in FIGS. 4A-4B, the porous dicing streets 404 (e.g., a porous silicon layer) are created on the substrate 402 (e.g., starting material) to define narrow scribe lines. This process may use a silicon oxide (SiOx)/nitride (Ni) mask to define the dicing streets.

At block 804, an active surface of the semiconductor wafer, including the porous silicon layer, is sealed. As shown in FIG. 6B, the porous silicon layer may be sealed (e.g., by heating) to prevent liquid or gas from entering the pores, which may complicate processing of the wafer. For example, the porous silicon layer may be sealed for a longer or shorter period of time in order to vary a sealing depth. A high temperature seal process may close a portion of the porous silicon layer proximate the active surface of the semiconductor wafer. For example, the porous silicon wafer may be heated in an atmosphere of $H_2$ at 900° C. (1652° F.) to 1100° C. (2012° F.) for approximately 5 to 10 minutes. This allows crystalline silicon to reflow and seal pores on the surface, making the wafer surface once again single crystal silicon. A non-limiting example of a temperature range for the annealing may be from ~260° C. (500° F.) to ~1100° C. (2012° F.). A depth of a sealed surface of the porous silicon layer varies according to a length of the high temperature seal process.

At block 806, a rear surface of the semiconductor wafer is subjected to a back grind process (e.g., back grinding) to expose the porous silicon wafer along the outline of the dies. At block 808, the semiconductor wafer is etched to release the dies to form, for example, diced RF chips. Due to the porous region including more surface area, the porous region will etch faster, enabling the release of the dies. In one aspect of the present disclosure, the etching is a tetramethylammonium hydroxide (TMAH) selective etching of the dicing street pattern for releasing multiple (e.g., a plurality of) diced radio frequency (RF) chips. Additionally, xenon difluoride ($XeF_2$), $SF_6$ plasma, and other related plasma etch gasses may be used to release the dies. An RF chip having dimpled sidewalls and/or terminated porous silicon sidewalls may be prepared by a process as shown in FIGS. 4A-4G.

The dicing process for RF integrated circuits supported by a substrate may be improved by using porous silicon. Porous silicon may be fabricated by introducing a silicon wafer to an electro-chemical etch in dilute hydrofluoric acid. Porous silicon is relatively cheap to produce. In inventive aspects, a porous layer is formed on a processed wafer to provide narrow scribe lines, which leads to simplified batch dicing.

In aspects of the present disclosure, a porous silicon layer is formed in the dicing streets to allow dicing of the wafer using a batch wet etch process. The batch release process may significantly reduce the cost and the cycle time for dicing wafers. For example, dies may be outlined with a porous silicon layer using reduced size dicing streets, as a saw blade is not used to dice the wafer. As a result, a kerf area loss (e.g., due to the conventional saw blade process) is substantially reduced. In this arrangement, diced RF chips may include a die having dimpled sidewalls and/or terminated porous silicon sidewalls. That is, the transition between the single crystal silicon and the porous silicon may be dimpled. In another configuration, the die has scalloped sidewalls. Alternatively, the die may have irregularly-shaped and dimpled sidewalls, or sidewalls that are otherwise irregularly-shaped (e.g., dimpled and/or scalloped sidewalls).

FIG. 9 is a schematic diagram of a radio frequency (RF) front end (RFFE) module 900 employing diced RF chips according to an aspect of the present disclosure. The RF front end module 900 includes power amplifiers 902, duplexer/filters 904, and a radio frequency (RF) switch module 906. The power amplifiers 902 amplify signal(s) to a certain power level for transmission. The duplexer/filters 904 filter the input/output signals according to a variety of different parameters, including frequency, insertion loss, rejection or other like parameters. In addition, the RF switch module 906 may select certain portions of the input signals to pass on to the rest of the RF front end module 900.

The RF front end module 900 also includes tuner circuitry 912 (e.g., first tuner circuitry 912A and second tuner circuitry 912B), a diplexer 919, a capacitor 916, an inductor 918, a ground terminal 915 and an antenna 914. The tuner circuitry 912 (e.g., the first tuner circuitry 912A and the second tuner circuitry 912B) includes components such as a tuner, a portable data entry terminal (PDET), and a house keeping analog to digital converter (HKADC). The tuner circuitry 912 may perform impedance tuning (e.g., a voltage standing wave ratio (VSWR) optimization) for the antenna 914. The RF front end module 900 also includes a passive combiner 908 coupled to a wireless transceiver (WTR) 920. The passive combiner 908 combines the detected power from the first tuner circuitry 912A and the second tuner circuitry 912B. The wireless transceiver 920 processes the information from the passive combiner 908 and provides this information to a modem 930 (e.g., a mobile station modem (MSM)). The modem 930 provides a digital signal to an application processor (AP) 940.

As shown in FIG. 9, the diplexer 919 is between the tuner component of the tuner circuitry 912 and the capacitor 916, the inductor 918, and the antenna 914. The diplexer 919 may be placed between the antenna 914 and the tuner circuitry 912 to provide high system performance from the RF front end module 900 to a chipset including the wireless transceiver 920, the modem 930 and the application processor 940. The diplexer 919 also performs frequency domain multiplexing on both high band frequencies and low band frequencies. After the diplexer 919 performs its frequency multiplexing functions on the input signals, the output of the diplexer 919 is fed to an optional LC (inductor/capacitor) network including the capacitor 916 and the inductor 918. The LC network may provide extra impedance matching components for the antenna 914, when desired. Then a signal with the particular frequency is transmitted or received by the antenna 914. Although a single capacitor and inductor are shown, multiple components are also contemplated.

FIG. 10 is a schematic diagram 1000 of a WiFi module 1070 including a first diplexer 1090-1 and an RF front end module 1050 including a second diplexer 1090-2 for a chipset 1060 including diced RF chips according to aspects of the present disclosure. The WiFi module 1070 includes the first diplexer 1090-1 communicably coupling an antenna 1092 to a wireless local area network module (e.g., WLAN module 1072). The RF front end module 1050 includes the second diplexer 1090-2 communicably coupling an antenna 1094 to the wireless transceiver (WTR) 1020 through a duplexer 1080. The wireless transceiver 1020 and the WLAN module 1072 of the WiFi module 1070 are coupled to a modem (MSM, e.g., baseband modem) 1030 that is powered by a power supply 1052 through a power management integrated circuit (PMIC) 1056. The chipset 1060 also includes capacitors 1062 and 1064, as well as an inductor(s) 1066 to provide signal integrity. The PMIC 1056, the modem 1030, the wireless transceiver 1020, and the WLAN module 1072 each include capacitors (e.g., 1058, 1032, 1022, and 1074) and operate according to a clock 1054. The geometry and arrangement of the various inductor and capacitor components in the chipset 1060 may reduce the electromagnetic coupling between the components.

Figure 11:
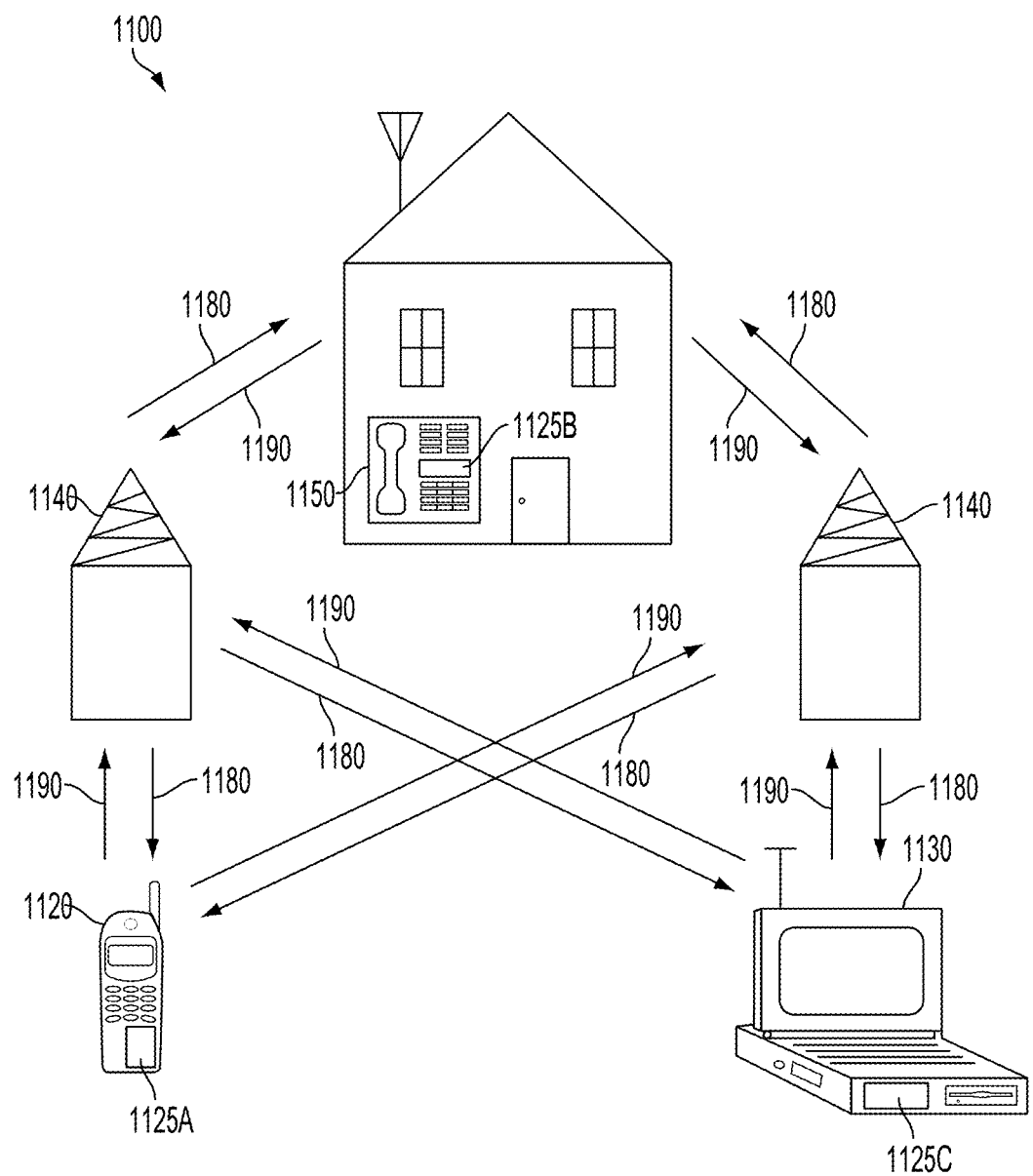
FIG. 11 is a block diagram showing an exemplary wireless communication system in which a configuration of the disclosure may be advantageously employed.

FIG. 11 is a block diagram showing an exemplary wireless communication system 1100 in which an aspect of the disclosure may be advantageously employed. For purposes of illustration, FIG. 11 shows three remote units 1120, 1130, and 1150 and two base stations 1140. It will be recognized that wireless communication systems may have many more remote units and base stations. Remote units 1120, 1130, and 1150 include IC devices 1125A, 1125C, and 1125B that include the disclosed diced RF chips. It will be recognized that other devices may also include the disclosed diced RF chips, such as the base stations, switching devices, and network equipment. FIG. 11 shows forward link signals 1180 from the base station 1140 to the remote units 1120, 1130, and 1150 and reverse link signals 1190 from the remote units 1120, 1130, and 1150 to base stations 1140.

In FIG. 11, remote unit 1120 is shown as a mobile telephone, remote unit 1130 is shown as a portable computer, and remote unit 1150 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 11 illustrates remote units according to the aspects of the disclosure, the disclosure is not limited to these exemplary illustrated units. Aspects of the disclosure may be suitably employed in many devices, which include the disclosed diced RF chips.

Figure 12:
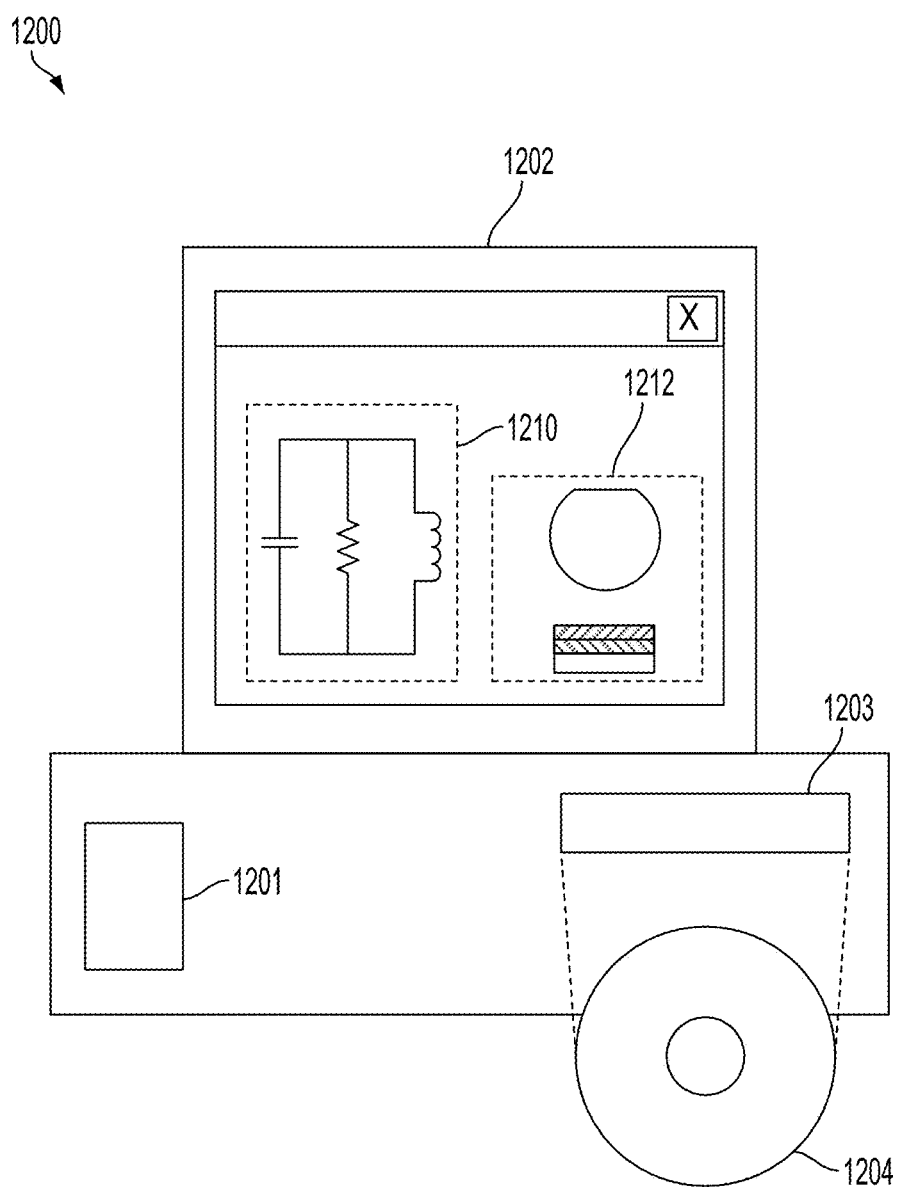
FIG. 12 is a block diagram illustrating a design workstation used for circuit, layout, and logic design of a semiconductor component according to one configuration.

FIG. 12 is a block diagram illustrating a design workstation used for circuit, layout, and logic design of a semiconductor component, such as the diced RF chips disclosed above. A design workstation 1200 includes a hard disk 1201 containing operating system software, support files, and design software such as Cadence or OrCAD. The design workstation 1200 also includes a display 1202 to facilitate design of a circuit 1210 or a semiconductor component 1212, such as diced RF chips. A storage medium 1204 is provided for tangibly storing the circuit design 1210 or the semiconductor component 1212. The circuit design 1210 or the semiconductor component 1212 may be stored on the storage medium 1204 in a file format such as GDSII or GERBER. The storage medium 1204 may be a CD-ROM, DVD, hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit design 1210 or the semiconductor component 1212 by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A method of dicing a semiconductor wafer, comprising:
    forming porous silicon dicing streets on a front surface of the semiconductor wafer, wherein the dicing streets define a plurality of dies to be singulated;
    sealing the front surface of the semiconductor wafer, including the porous silicon dicing streets, to form a single crystal active layer;
    then fabricating active semiconductor devices on the single crystal active layer of the semiconductor wafer;
    back grinding a rear surface of the semiconductor wafer to reach the porous silicon dicing streets on the front surface; and
    etching the semiconductor wafer to singulate the plurality of dies along the porous dicing streets.

2. The method of claim 1, in which:
    the sealing comprises heating the front surface of the semiconductor wafer; and
    a depth of a sealed surface of the porous silicon dicing streets varies according to a temperature and a duration of the heating.

3. The method of claim 1, in which forming the porous silicon dicing streets comprises:
    masking the front surface of the semiconductor wafer to define a dicing street pattern; and
    processing the semiconductor wafer to form the porous silicon dicing streets along the dicing street pattern.

4. The method of claim 3, in which the masking comprises a silicon oxide (SiOx)/nitride (Ni) mask to create the dicing street pattern.

5. The method of claim 1, in which the etching uses a batch wet etch process to singulate the dies.

6. The method of claim 1, in which:
    the dicing streets are non-rectilinear; and
    the plurality of dies defined by the dicing streets have non-rectangular shapes.

7. A first integrated circuit (IC) die manufactured by a process, comprising:
    forming porous silicon dicing streets on a front surface of a semiconductor wafer, in which the dicing streets define a plurality of IC dies, including the first IC die, to be singulated from the semiconductor wafer;
    sealing the front surface of the semiconductor wafer, including the porous silicon dicing streets, to form a single crystal active layer;
    then fabricating active semiconductor devices on the single crystal active layer of the semiconductor wafer;
    back grinding a rear surface of the semiconductor wafer to reach the porous silicon dicing streets on the front surface; and
    etching the semiconductor wafer to singulate the plurality of IC dies, including the first IC die, from the semiconductor wafer, along the porous silicon dicing streets.

8. The IC die of claim 7, in which:
    the sealing comprises heating the front surface of the semiconductor wafer; and
    a depth of a sealed surface of the porous silicon dicing streets varies according to a temperature and a duration of the heating.

9. The IC die of claim 7, in which forming the porous silicon dicing streets comprises:
    masking the front surface of the semiconductor wafer to define a dicing street pattern; and
    processing the semiconductor wafer to form the porous silicon dicing streets along the dicing street pattern.

10. The IC die of claim 9, in which the masking comprises a silicon oxide (SiOx)/nitride (Ni) mask to create the dicing street pattern.

11. The IC die of claim 7, in which the etching uses a batch wet etch process to singulate the plurality of IC dies.

12. The IC die of claim 7, in which:
    the dicing streets are non-rectilinear; and
    the IC die has a non-rectangular shape.

* * * * *